United States Patent [19]

Sugimoto

[11] Patent Number: 5,440,711

[45] Date of Patent: Aug. 8, 1995

[54] METHOD FOR CONTROLLING DRAM MEMORY IN A MICROCOMPUTER

[75] Inventor: Masaki Sugimoto, Itami, Japan

[73] Assignee: Mitsubishi Denki Kabushiki Kaisha, Tokyo, Japan

[21] Appl. No.: 167,604

[22] Filed: Dec. 13, 1993

Related U.S. Application Data

[63] Continuation of Ser. No. 664,185, Mar. 1, 1991, Pat. No. 5,317,709.

[30] Foreign Application Priority Data

Mar. 5, 1990 [JP] Japan ................. 2-054006

[51] Int. Cl.$^6$ ............... G06F 12/08; G06F 13/18
[52] U.S. Cl. ................. 395/433; 364/246.1; 364/246.91; 364/964.2; 364/964.9; 364/968; 364/DIG. 1; 365/222
[58] Field of Search ... 364/200 MS File, 900 MS File; 395/400 MS, 425 MS; 365/222

[56] References Cited

U.S. PATENT DOCUMENTS

| | | | |
|---|---|---|---|
| 4,796,232 | 1/1989 | House | 365/189 |
| 4,870,622 | 9/1989 | Aria et al. | 365/230.02 |
| 4,884,234 | 11/1989 | Keys et al. | 395/425 |
| 4,924,381 | 5/1990 | Tikuume | 395/425 |
| 4,943,960 | 7/1990 | Komatsu et al. | 365/222 |
| 4,954,951 | 9/1990 | Hyatt | 395/425 |
| 4,965,717 | 10/1990 | Cutts, Jr. et al. | 395/425 |
| 5,134,699 | 7/1992 | Aria et al. | 395/425 |
| 5,317,709 | 5/1994 | Sugimoto | 395/425 |

OTHER PUBLICATIONS

Goodman, et al. "The Use of Static Column RAM as a Memory Hierarchy," Unknown IEEE publication, 1984.
Intel Advance Information 80C186, "CHMOS High Integration 16-BIT Microprocessor", Sep., 1987, Intel Corporation.
8203 64K Dynamic Ram Controller manual, Intel, Nov., 1987, pp. 2-1-2-16.

Primary Examiner—Reba I. Elmore
Attorney, Agent, or Firm—Townsend and Townsend Khourie and Crew

[57] ABSTRACT

There is provided a microcomputer including therein a DRAM controller, the DRAM controller including a refresh controller for refreshing a DRAM and an access controller for controlling the access to the DRAM whereby the need of a DRAM controlling external circuit that suffers from severe timing adjustment is eliminated and hence the DRAM is made directly connectable to the microcomputer.

3 Claims, 10 Drawing Sheets

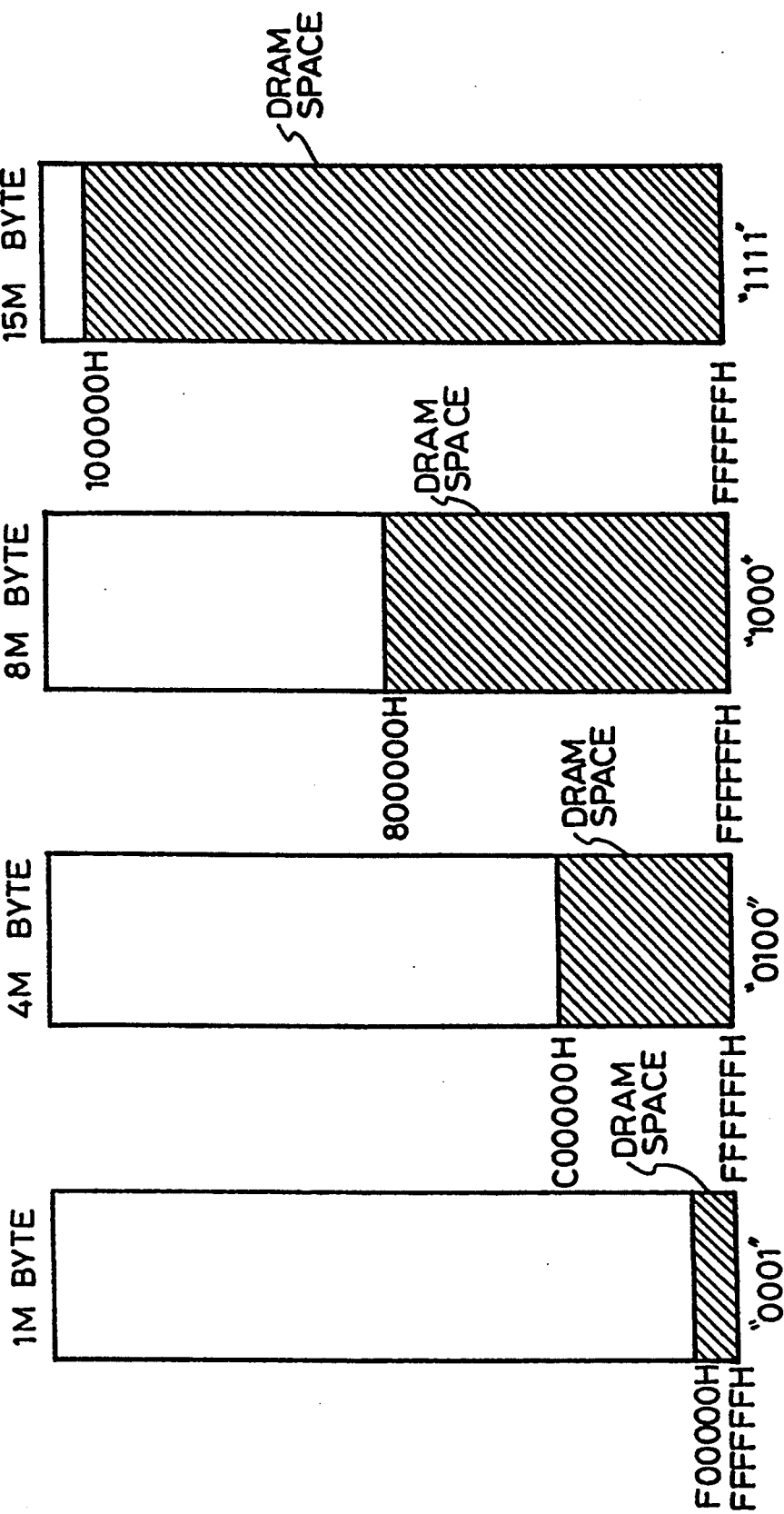

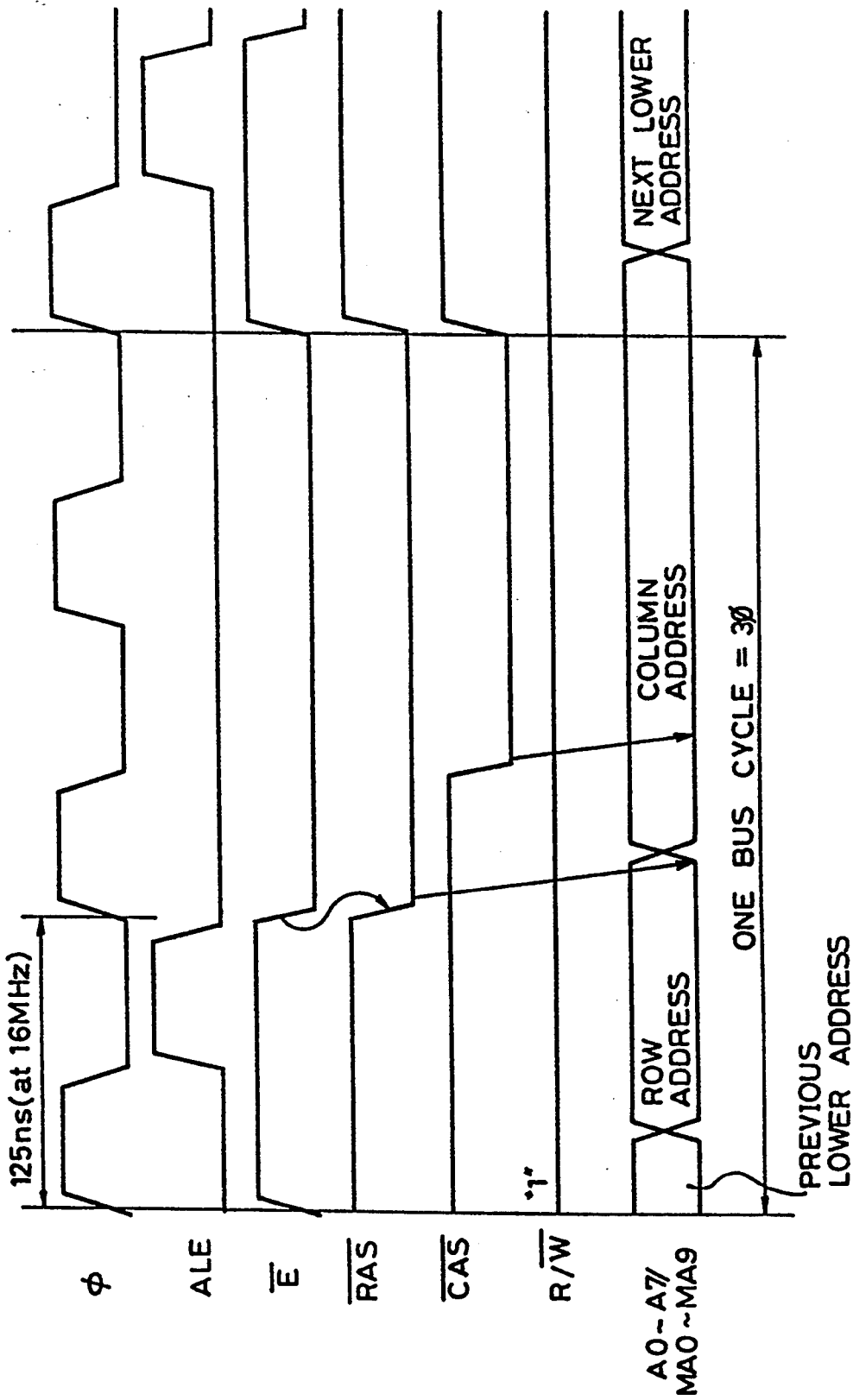

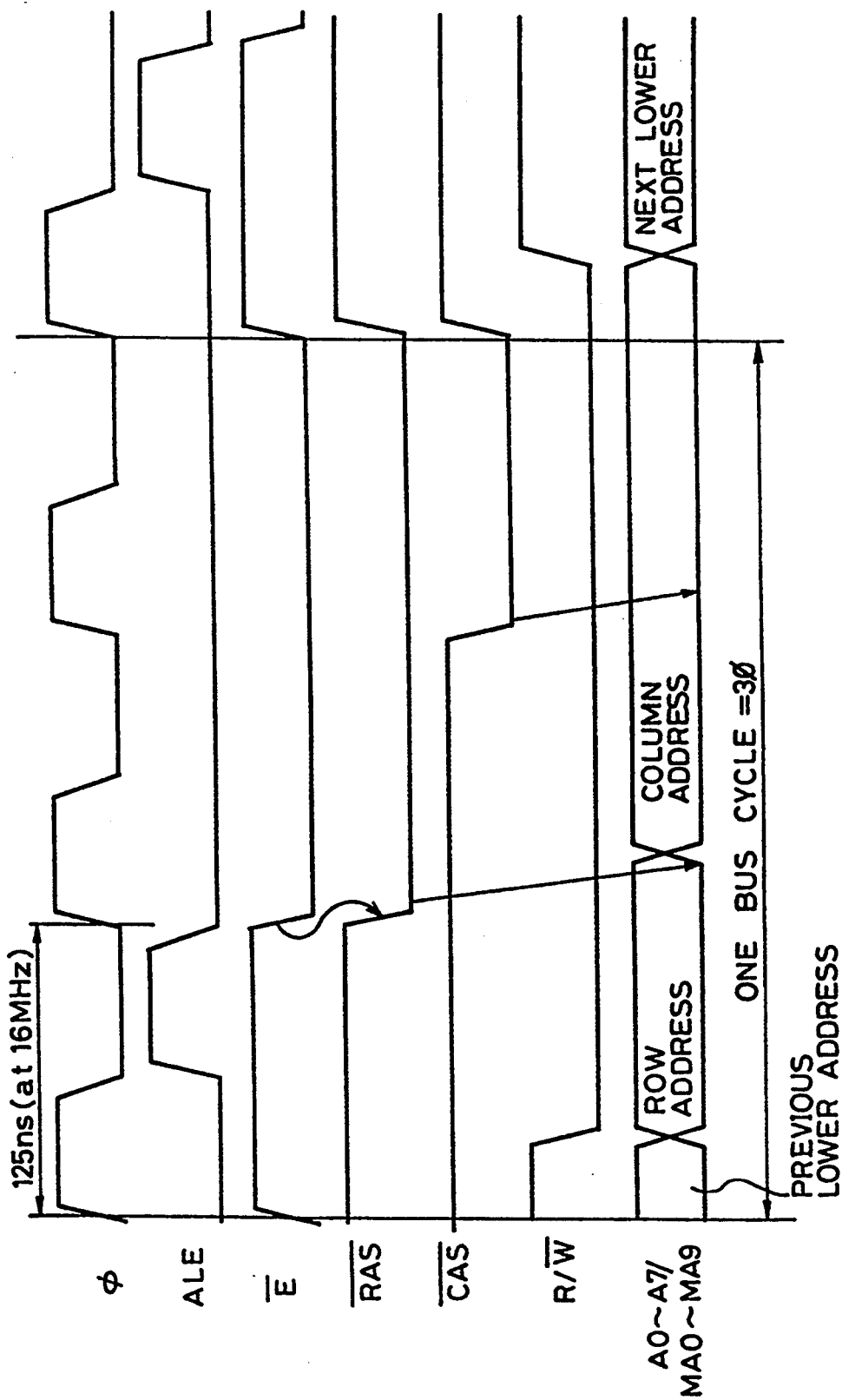

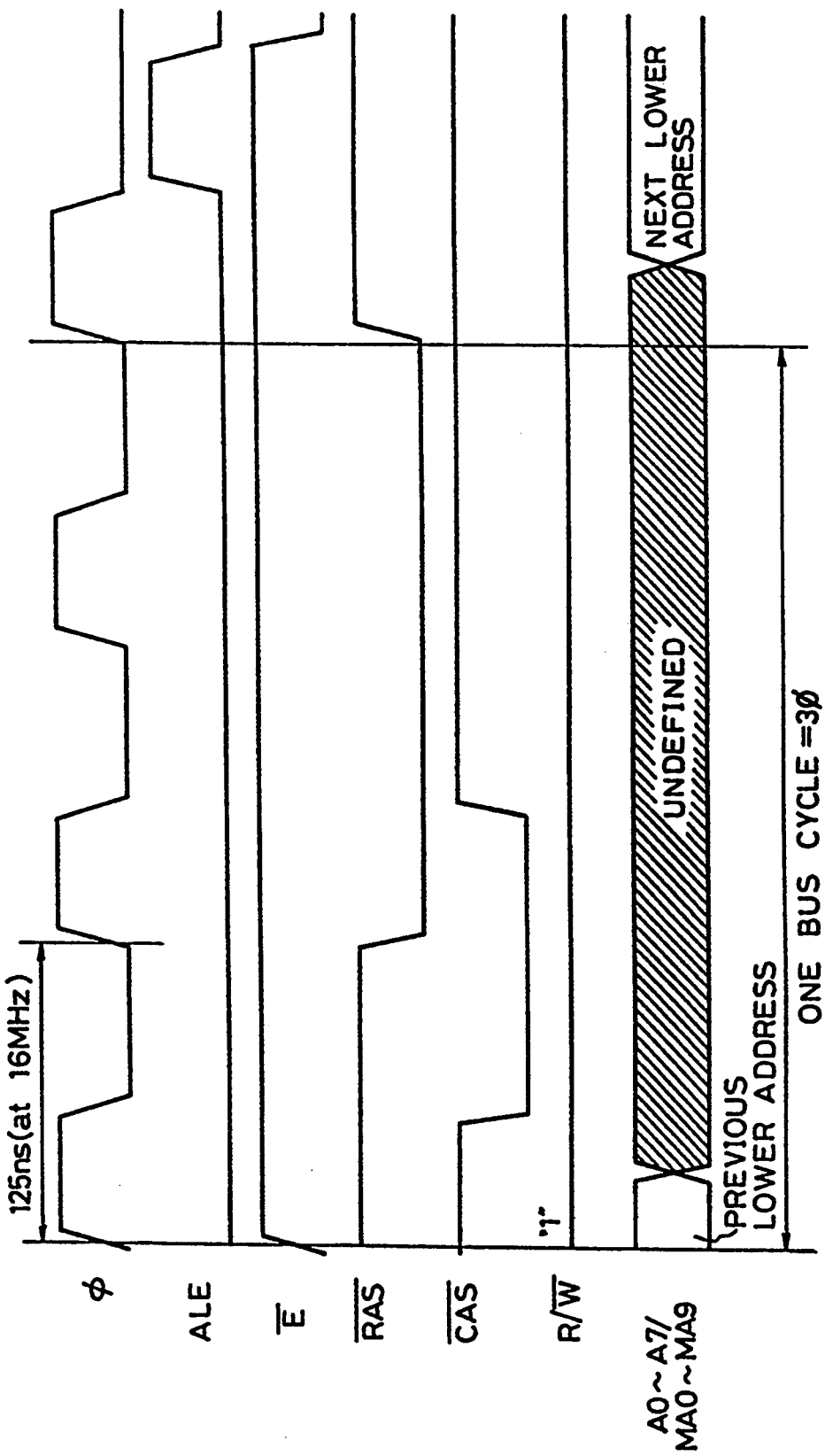

METHOD FOR CONTROLLING DRAM MEMORY IN A MICROCOMPUTER

This is a continuation of application Ser. No. 07/664,185 filed Mar. 1, 1991 now U.S. Pat. No. 5,317,709, issued May 13, 1994.

BACKGROUND OF THE INVENTION

1. Field of the Invention

The present invention relates to a microcomputer including a memory controller that refreshes a dynamic memory.

2. Description of the Prior Art

Referring to FIGS. 7 and 8, a prior microcomputer is illustrated. In the figures, designated at 1 is a microcomputer and 2 is a dynamic random access memory (DRAM). The microcomputer 1 includes a DRAM controller 3 composed of a refresh controller (refresh control means) 3a. Designated at 4 is a central processing unit (CPU). The refresh controller 3a includes an internal counter 5 for counting an internal clock $\phi$, a memory control register (MCR) 6 for defining how many of the internal clock $\phi$ pulses should be counted, a bus priority decision circuit 7 for controlling a refresh request together with other bus requests, and a refresh address counter 8 for refreshing the DRAM2. Additionally, designated at 9 is an internal bus.

Operation of the prior microcomputer is as follows. The interval counter 5 counts the internal clock $\phi$ and issues a refresh request to the bus priority decision circuit 7 in a proper value of the counts defined by the MCR6 for every 32 $\phi$, for example from 32 $\phi$ to 256 $\phi$. The bus priority decision circuit 7 controls the other bus requests such for example as those of a CPU bus access, a direct memory access controller (DMAC) bus access, and a bus access request by an external bus master, and updates the refresh address counter 8 to refresh the DRAM2 provided that the conditions are to respond to the refresh request. For the DRAM refreshing performed at that time RAS-only refreshing is usually available.

The prior microcomputer is constructed as described above, and the DRAM controller 3 is a refresh controller for obtaining the refresh timing, refresh address, and refresh signal for the DRAM2, without having any other function. On the contrary, in order to have an access to the DRAM2, there are required row/column address generator means for generating row/column addresses to be inputted into the DRAM2 in addition to the refresh controller 3a and access signal generator means for generating RAS and CAS signals for strobing the foregoing addresses, which are needed to be realized with an external circuit of the microcomputer shown in FIG. 8. These signals suffer from considerably severe timing thereamong, so that an external high speed TTL such as an AS (advanced Schottky) circuit, a digital delay line, and the like must be used for assuring in reserve the set-up time of a row address for the RAS signal and the holding time of the same, switching timing between row and column addresses, and the set-up and holding time of a column address for the CAS signal, etc.

SUMMARY OF THE INVENTION

In view of the drawbacks with the prior art, it is an object of the present invention to provide a microcomputer capable of elimination of the need of an external circuit and hence timing adjustment of the same, and of direct connection thereof to a memory.

To achieve the above object, a microcomputer according to the present invention includes a memory controller composed of refresh control device for controlling the refresh of a memory and of access control device for controlling the access to the memory, said access control device comprising a memory control register having a memory access effective bit for making effective the access to a set memory space and an access signal generator circuit for generating a RAS signal and a CAS signal for strobing a row address, a column address, and both addresses in having an access to said memory space, whereby said memory controller composed of said refresh control device and said access control device decides the priority of an associated bus when the memory access effective bit is on, and refreshes the accessed memory space provided the control should answer a refresh request.

The above and other objects, features, and advantages of the invention will become more apparent from the following description when taken in conjunction with the accompanying drawings.

BRIEF DESCRIPTION OF THE DRAWINGS

FIGS. 3A–3D illustrate the configuration of a memory space in the microcomputer of the present embodiment;

FIG. 5A is a read timing chart of a generated signal;

FIG. 5B is a write timing chart of a generated signal;

FIG. 5C is a refresh timing chart of a generated signal;

DESCRIPTION OF THE PREFERRED EMBODIMENT

Figure 7:
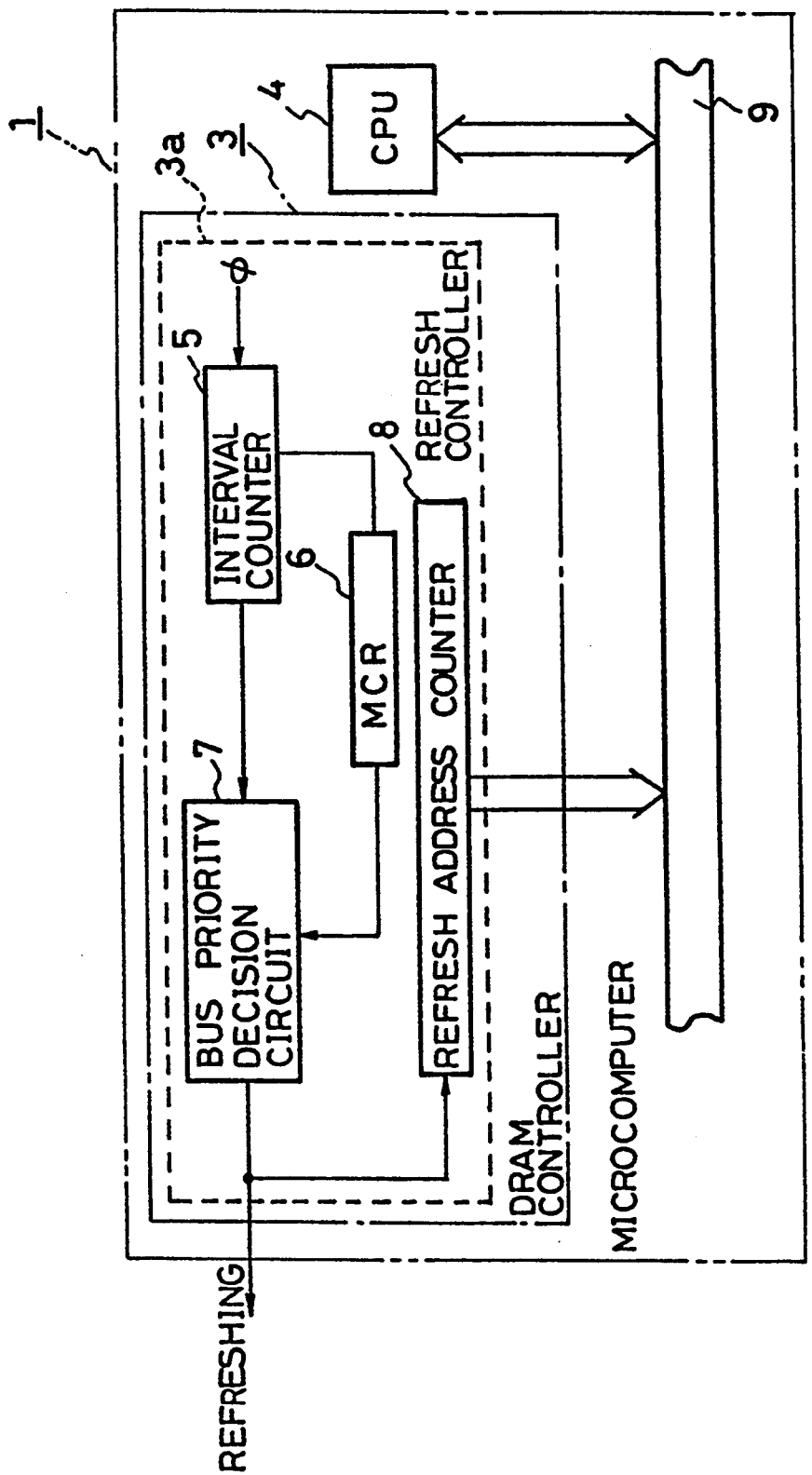
FIG. 7 is a block diagram of a prior microcomputer.
Figure 8:
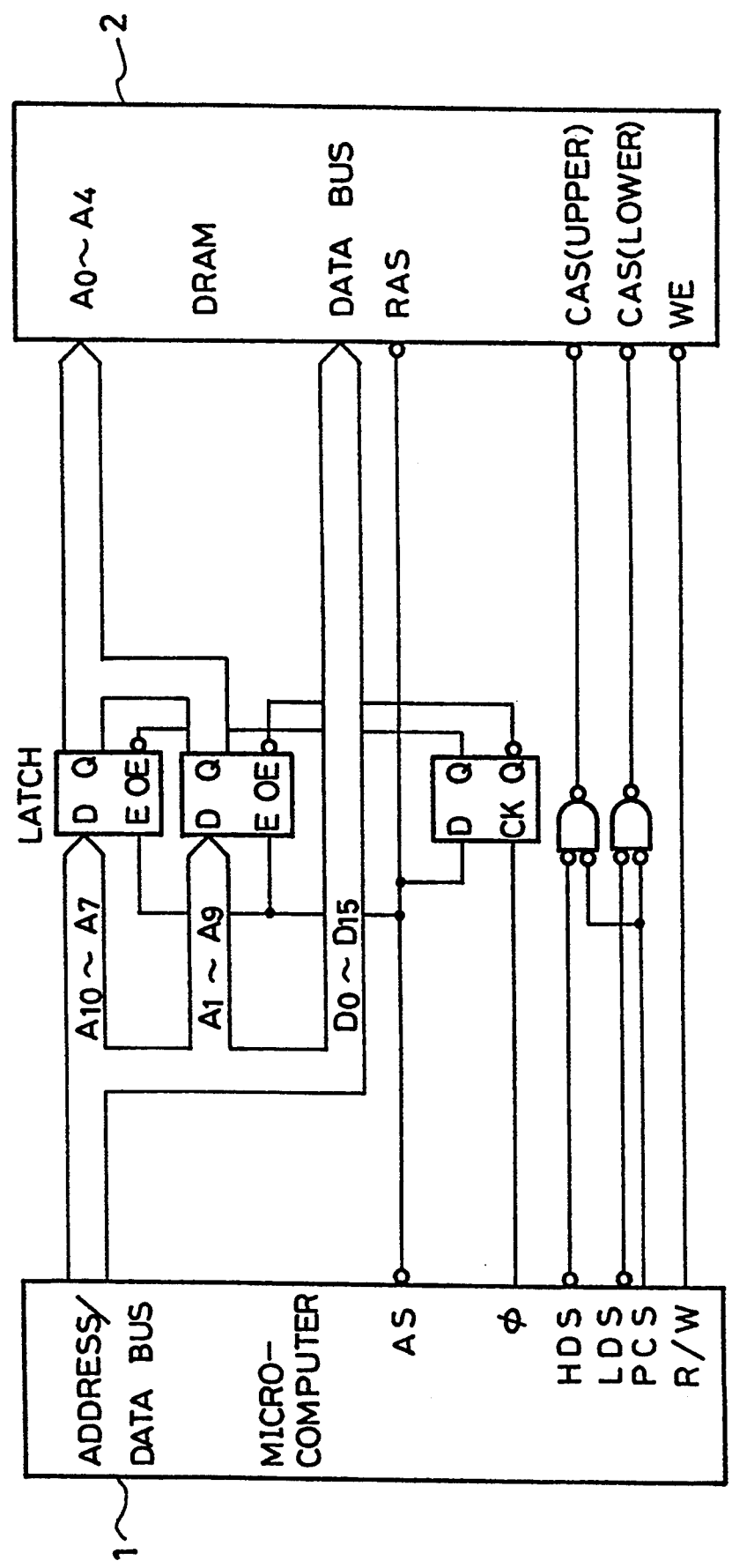
FIG. 8 is a block diagram of a DRAM access circuit in the prior microcomputer.

In what follows, a microcomputer as an embodiment of the present invention will be described with reference to FIGS. 1 through 5. Description of constituent members with the like symbols as those illustrated in FIGS. 7 and 8 is here omitted.

Figure 1:
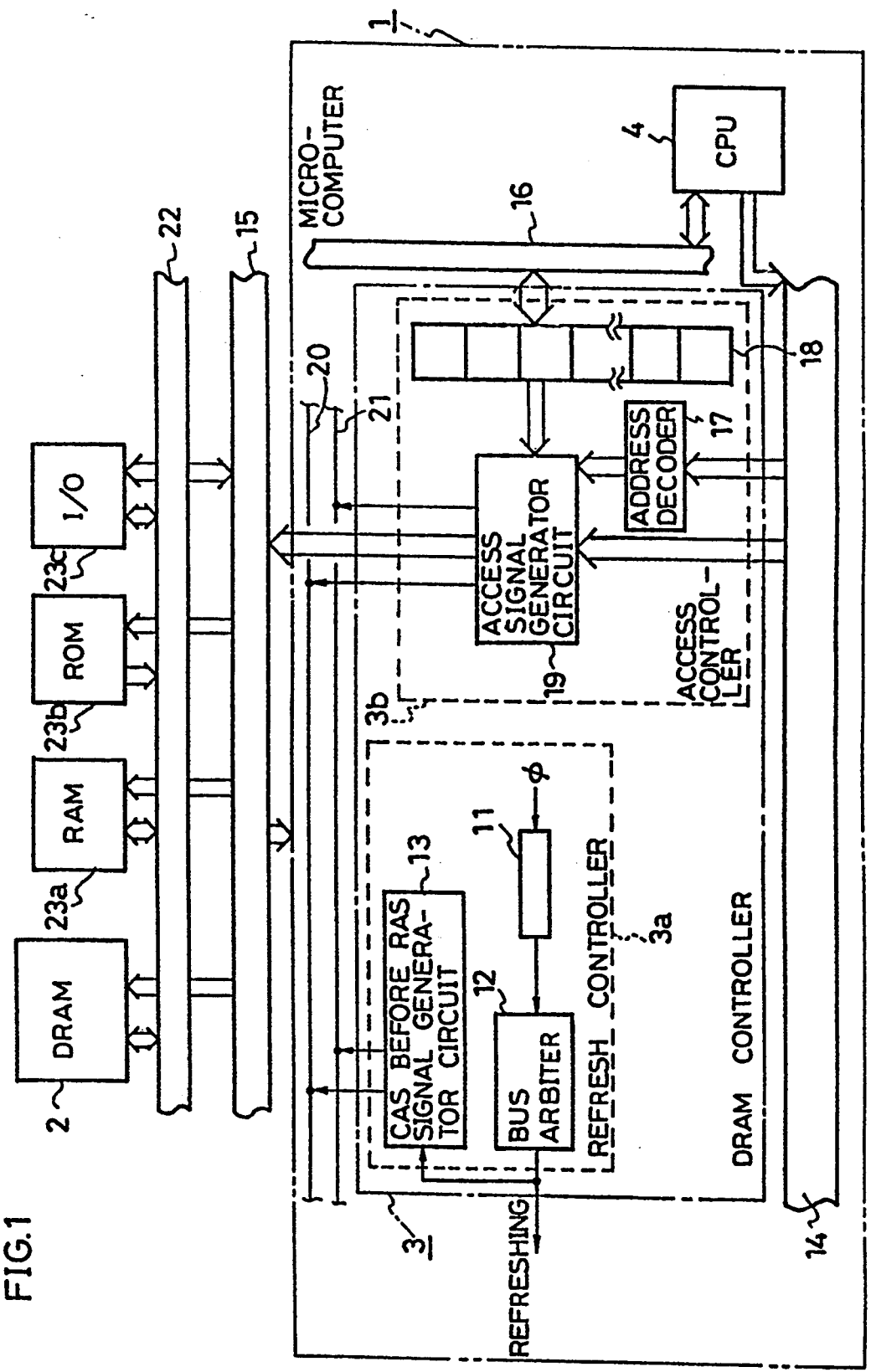
FIG. 1 is a block diagram of a microcomputer as an embodiment of the present invention.

Referring to FIG. 1, a microcomputer 1 is illustrated in the form of a block diagram. In the same figure, designated at 3 is a DRAM controller including a refresh controller 3a and an access controller (access control device) 3b, 11 is a refresh counter for counting an internal clock $\phi$, 12 is a bus arbiter, 13 is a CAS before RAS signal generator circuit for outputting a CAS before RAS signal which controls refresh operation, 14 is an internal address bus, 15 is an external time division address bus, 16 is an internal data bus, 17 is an address decoder, 18 is a DRAMC control register comprising DRAM area selection bis $b_0$ through $b_3$ and a DRAM access effective bit $b_7$, 19 is an access signal generator circuit formed of an EPROM or the like for generating time division addresses and RAS and CAS signals for strobing those addresses, 20 is a RAS address line, and 21 is a CAS address line. The microcomputer 1 is connected to peripheral devices such as a random access memory (RAM) 23a, a read only memory (ROM) 23b, and an input/output (I/O) unit 23c, etc., through the external time division address bus 15 and the external data bus 22.

Figure 2:
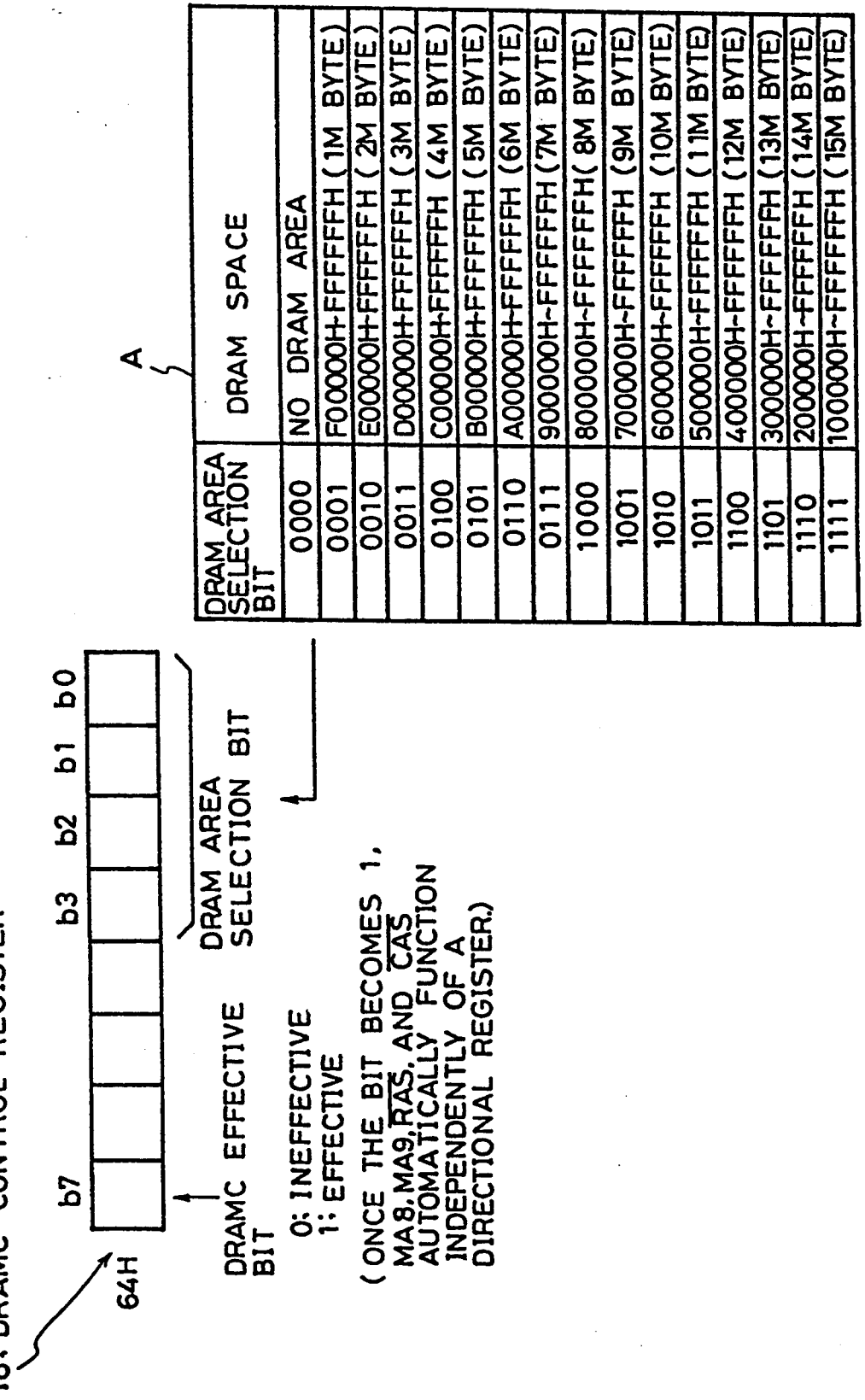
FIG. 2 is a view illustrating a bit map in a DRAM control register.
Figure 4B:
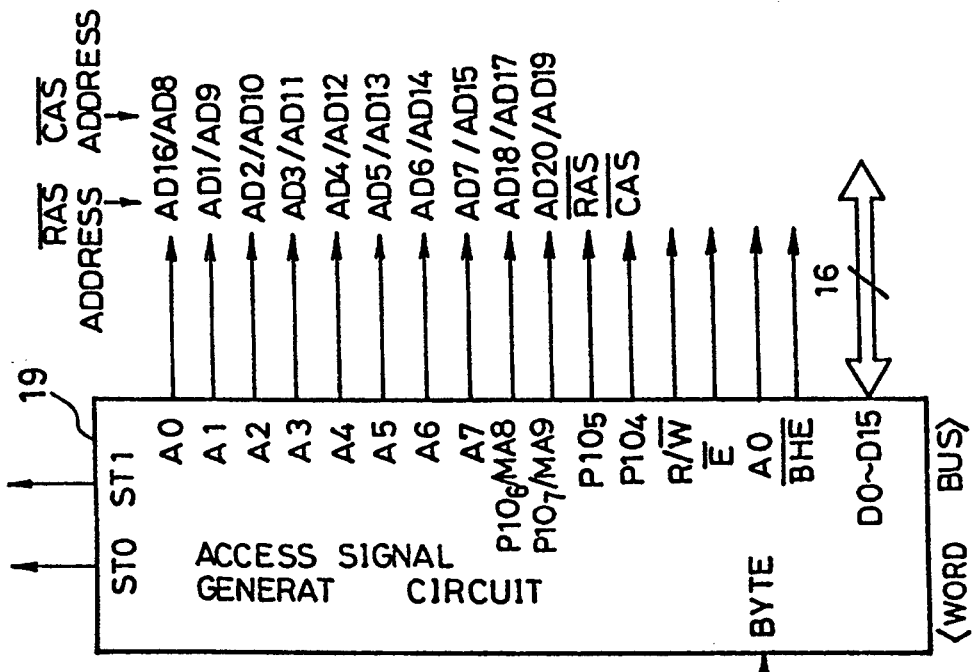
FIGS. 4A and 4B are block diagrams illustrating the distribution of signal generation of an access signal generator circuit.
Figure 4A:
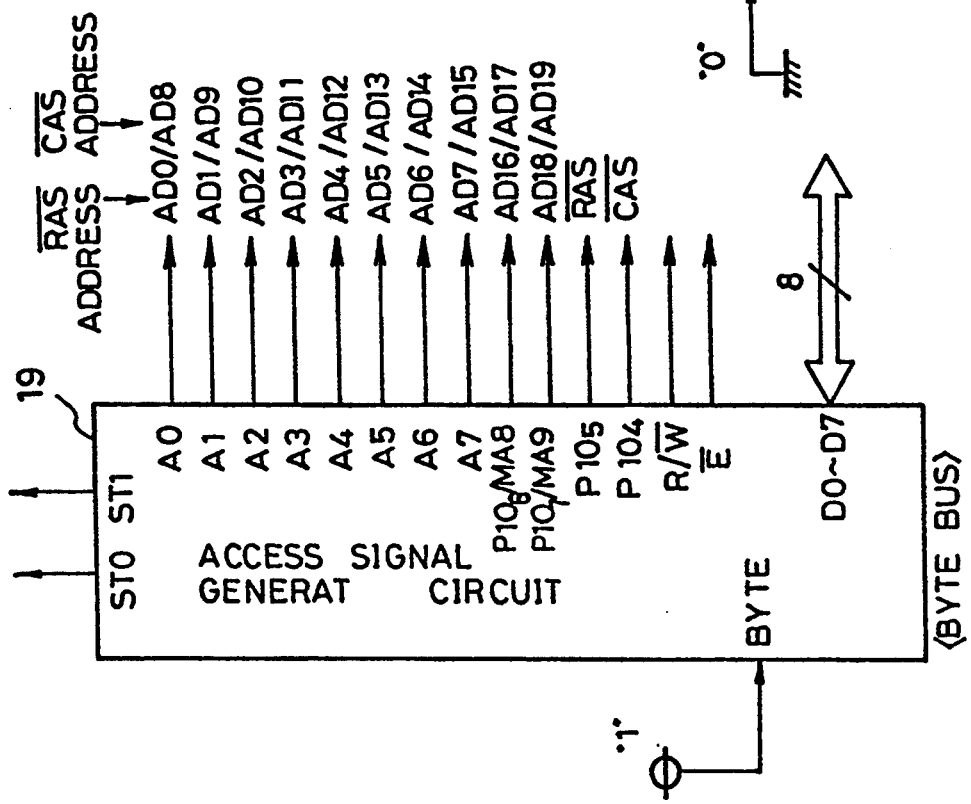
Figure 6:
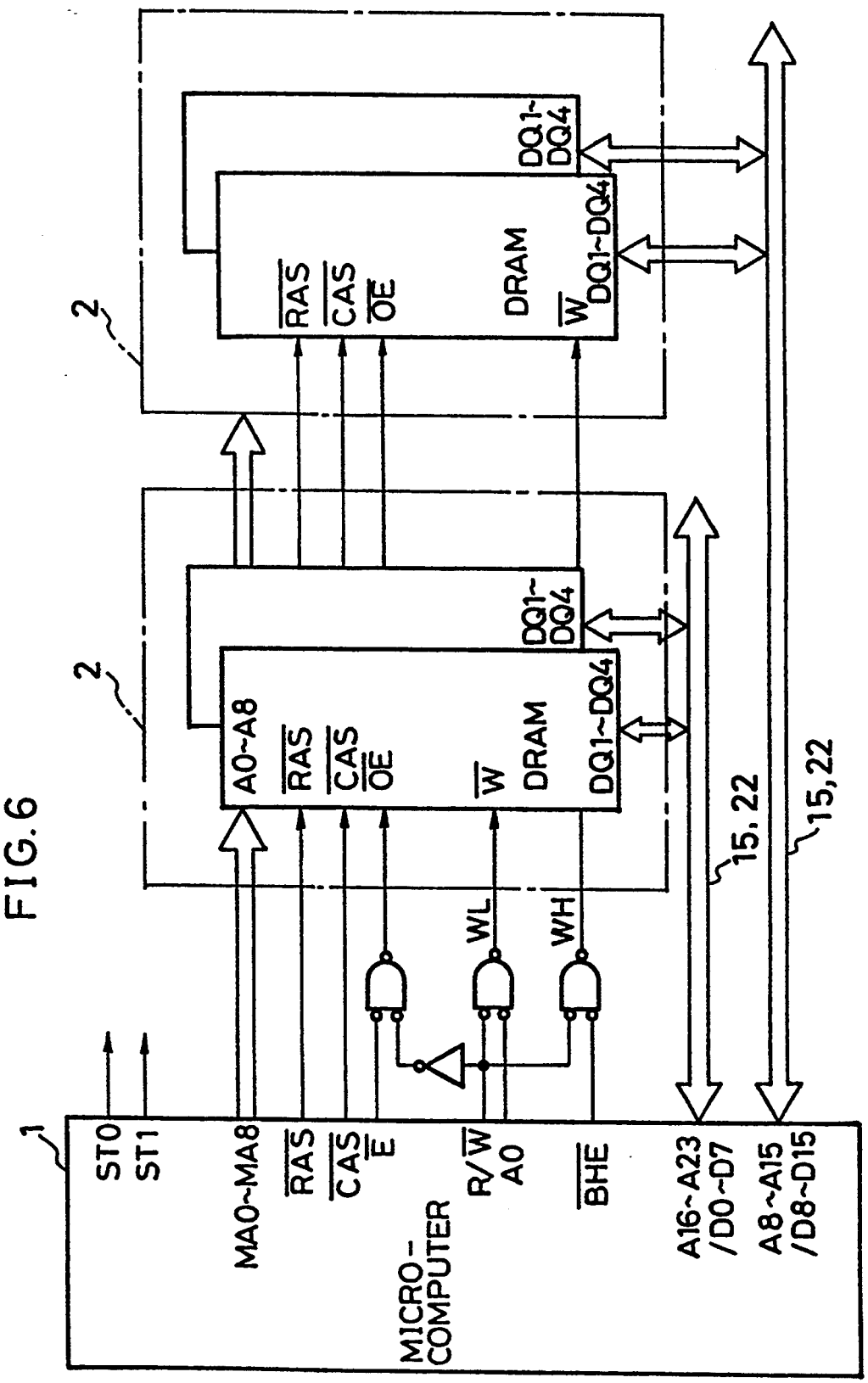
FIG. 6 is a block diagram of a microcomputer of another embodiment of the present invention.

Referring to FIG. 2, the DRAMC control register 18 and a bit map A of the same are illustrated. Referring to FIG. 3, the configuration of a DRAM space assigned by the DRAM area selection bits $b_0$ through $b_3$ in the DRAMC control register 18 is illustrated, and referring further to FIG. 4, it is illustrated what signal the access signal generator circuit 19 shown in FIG. 1 generates on the external time division address bus. Herein, the microcomputer 1 is free to select a 24 bit address bus for directly having an access to a 16M byte memory space and an external 8 or 16 bit width data bus through switching of BYTE terminals (8 bit data buses D0 through D7 when BYTE=1 in FIG. 4A, and 16 bit data buses D0 through D15 when BYTE=0 in FIG. 4B). Since any data is input onto and output from the 24 bit address bus at the high order and middle order of the same in time division, an address to access the DRAM2 is constructed with least significant 8 bits of the address bus and other two address lines, amounting the maximum 10 time division address lines. Referring further to FIGS. 5A through 5C, generation timings of the time division address lines, and the RAS and CAS signals are illustrated in three cases of read accessing, write accessing, and refreshing.

Operation of the embodiment is as follows. The DRAM area selection bits $b_0$ through $b_3$ are set like the bit map A, so that the memory space becomes a DRAM set space of from a minimum 1M byte of addresses F00000H through FFFFFFH ("0001" in the bit map A) as shown in FIG. 3A to a maximum 15M bytes ("1111" in the bit map B) of the addresses 100000H through FFFFFFH as shown in FIG. 3D. The DRAM space can be programmed in the unit of 1M bytes by the cpu4 through the data bus 16. Additionally, the DRAM access effective bit $b_7$ is a bit to define whether the access to the DRAM2 is effective or ineffective and controls the generation of the RAS signal and the CAS signal.

Now, when the DRAM access effective bit $b_7$ is on ("1") with respect to the DRAM set space, the address decoder 17 acts on an address to which the CPU4 has an access, and if the address is located in the DRAM space, the address decoder forces the CPU to wait even if there is existent any refresh request and further starts the access signal generator circuit 19. Further, when the CPU4 does not have any access, the refresh counter 11 counts the internal clock $\phi$, and if there is produced an overflow in the refresh counter 11, the refresh request is issued to the bus arbiter 12. The bus arbiter 12 judges which has priority to between another bus request and the refresh request, and if the refresh request should be answered, it supplies the RAS and CAS signals to the RAS address line 20 and the CAS address line 21 through the CAS before RAS generator circuit 13 in specific timing shown in FIG. 5C upon refreshing, to refresh the DRAM2. In this refreshing system, there is eliminated the need of a counter such as the refresh address counter $\delta$ of the prior microcomputer 1 shown in FIG. 7, and hence the construction of the refresh controller 3a is simplified. Further, when the DRAM access and the DRAM refresh compete with each other, the DRAM refresh has priority to the DRAM access, whereby the refresh controller 3a executes refreshing even during the DRAM access. However, when the DRAM refresh do not compete with the DRAM or when the DRAM access does not occur so frequent, there is provided, besides the DRAM access effective bit $b_7$, in the DRAM control register 18, another control bit for restricting the operation of the DRAM refresh controller 3a. With this control bit being 1, the refresh controller 3a does not allow the bus arbiter 12 to issue the refresh request and automatically issue a signal shown in FIG. 5C. Hereby, the DRAM2 can automatically be refreshed by the unique refresh system of the CAS before RAS, so that the bus access efficiency of the CPU4 itself can be improved without going to the trouble of generating the refresh addresses.

With the construction described above, the microcomputer 1 includes therein the DRAM controller 3 having the access controller 3b in addition to the refresh controller 3a, so that a space in which the DRAM2 is disposed is flexibly selectable and the external circuit can be made inexpensive and directly connectable to the DRAM2 without requiring any adjustment of the timing.

According to the present invention, as described above, the microcomputer includes the memory controller which decides the priority of any associated bus when the memory access effective bit of the access control device, and, which, if the refresh request should be answered, forces the refresh control device to refresh the memory space to which the access control device has an access. Therefore, there are eliminated the need of realizing an access to the memory with an external circuit and the need of adjusting timing, thereby assuring the direct connection of the memory to the external circuit.

What is claimed is:

1. A method for operating a computer having a memory, the method comprising the steps of:
    defining a portion of said memory as an active memory space by asserting a plurality of area selection bits whereby the remainder of said memory is an inactive memory space;
    asserting a memory access effective bit, said bit for permitting access to said memory space and for controlling generation of row address strobe (RAS) and column address strobe (CAS) signals;
    asserting a refresh request to refresh said active memory space;
    asserting a CPU memory access request to said active memory space;
    arbitrating between said refresh request and said CPU memory access request;
    delaying, at least until refresh of said active memory space is complete, the CPU memory access request when said CPU memory access request requests data in said active memory space; and
    refreshing said memory, including said active and said inactive memory space, by asserting said CAS signal before asserting said RAS signal.

2. The method of claim 1, wherein said step of arbitrating further comprises the steps of:
    using a register to count cycles of an internal clock; and
    assigning priority to and executing said refresh request when said register is in an overflow condition.

3. The method of claim 1 further comprising the step of executing said CPU access request by activating an access signal generator to strobe a row address and a column address.

* * * * *